US008969987B2

(12) United States Patent  
Rennie

(10) Patent No.: US 8,969,987 B2  
(45) Date of Patent: *Mar. 3, 2015

(54) SOLID-STATE IMAGING DEVICE

(75) Inventor: John Rennie, Tokyo (JP)

(73) Assignee: Sony Corporation, Tokyo (JP)

( * ) Notice: Subject to any disclaimer, the term of this patent is extended or adjusted under 35 U.S.C. 154(b) by 224 days.

This patent is subject to a terminal disclaimer.

(21) Appl. No.: 13/067,918

(22) Filed: Jul. 7, 2011

(65) Prior Publication Data

US 2011/0278688 A1 Nov. 17, 2011

Related U.S. Application Data

(63) Continuation of application No. 11/974,605, filed on Oct. 15, 2007, now Pat. No. 7,986,018.

(30) Foreign Application Priority Data

Oct. 23, 2006 (JP) ................................. 2006-287775  
Sep. 26, 2007 (JP) ................................. 2007-249966

(51) Int. Cl.
| | |
|---|---|
| H01L 31/0232 | (2014.01) |
| H01L 27/146 | (2006.01) |
| G02B 5/20 | (2006.01) |
| G02B 5/22 | (2006.01) |
| H01L 31/0352 | (2006.01) |

(52) U.S. Cl.  
CPC .......... *H01L 27/14645* (2013.01); *G02B 5/201* (2013.01); *G02B 5/223* (2013.01); *H01L 27/14621* (2013.01); *H01L 27/14685* (2013.01); *H01L 31/0352* (2013.01); *H01L 27/14627* (2013.01)  
USPC .............................. 257/432; 257/98; 257/294

(58) Field of Classification Search  
USPC ........................................... 257/432, 98, 294  
See application file for complete search history.

(56) References Cited

U.S. PATENT DOCUMENTS

| | | | | |
|---|---|---|---|---|
| 6,069,350 | A * | 5/2000 | Ohtsuka et al. ............ | 250/208.1 |
| 6,690,049 | B2 * | 2/2004 | Suzuki et al. ................. | 257/294 |
| 6,914,265 | B2 * | 7/2005 | Bawendi et al. ............... | 257/98 |
| 6,970,293 | B2 * | 11/2005 | Natori .......................... | 359/626 |
| 7,279,716 | B2 * | 10/2007 | Chen ............................. | 257/94 |
| 7,411,620 | B2 * | 8/2008 | Taniguchi et al. ............ | 348/294 |
| 7,745,900 | B2 * | 6/2010 | Li et al. ......................... | 257/437 |
| 7,750,797 | B2 * | 7/2010 | Laure et al. ................... | 340/442 |
| 2005/0205901 | A1 * | 9/2005 | Suzuki .......................... | 257/291 |

(Continued)

FOREIGN PATENT DOCUMENTS

| | | |
|---|---|---|
| JP | 57-028362 | 2/1982 |
| JP | 61-124901 | 6/1986 |
| JP | 04-094529 | 3/1992 |
| JP | 04-094855 | 3/1992 |
| JP | 11-027588 | 1/1999 |
| JP | 2000-340776 | 12/2000 |
| JP | 2002-510866 | 4/2002 |
| JP | 2004-103964 | 4/2004 |
| JP | 2004-200360 A | 7/2004 |
| JP | 2008-522418 | 6/2008 |
| KR | 2007-094679 | 9/2007 |
| WO | WO-2006-058452 | 6/2006 |

\* cited by examiner

*Primary Examiner* — Eugene Lee  
(74) *Attorney, Agent, or Firm* — Rader, Fishman & Grauer PLLC

(57) ABSTRACT

A solid-state imaging device includes a light-receiving portion, an optical filter layer, and quantum dots. The light receiving portion, where a photoelectric conversion is carried out, is formed in a semiconductor substrate. The optical filter layer is directly formed on or formed through another layer on the surface of the semiconductor substrate in which the light-receiving portion is formed. Quantum dots having substantially equal diameters are formed in the optical filter layer. The quantum dots have higher refractive indexes than the refractive index of the optical filter layer in which the quantum dots are embedded.

21 Claims, 12 Drawing Sheets

(56) References Cited

U.S. PATENT DOCUMENTS

| | | |
|---|---|---|
| 2005/0205958 A1 | 9/2005 | Taniguchi et al. |
| 2006/0054986 A1 | 3/2006 | Yu |
| 2006/0076636 A1 | 4/2006 | Fukunaga |
| 2008/0017940 A1 | 1/2008 | Yang |
| 2008/0020235 A1 | 1/2008 | Parce et al. |
| 2008/0105939 A1 | 5/2008 | Keh et al. |
| 2008/0218068 A1 | 9/2008 | Cok |
| 2009/0015907 A1 | 1/2009 | Nukeaw et al. |

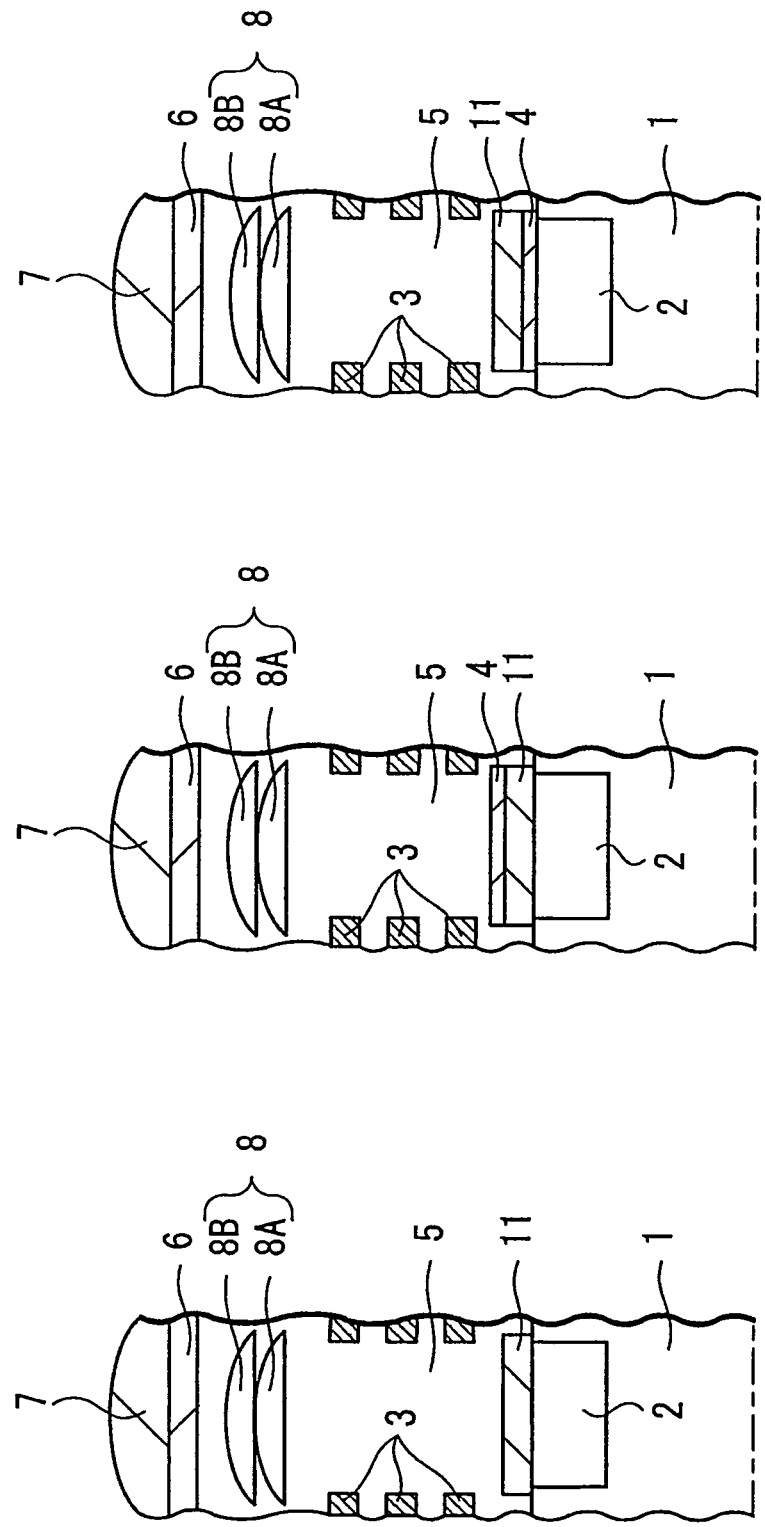

SOLID-STATE IMAGING DEVICE

CROSS REFERENCES TO RELATED APPLICATIONS

This is a Continuation Application of U.S. patent application Ser. No. 11/974,605, filed Oct. 15, 2007, which in turn claims priority from Japanese Application Nos.: JP2006-287775, filed Oct. 23, 2006, and JP2007-249966, filed Sep. 26, 2007. The entire contents of both priority Japanese applications are incorporated herein by reference.

BACKGROUND OF THE INVENTION

1. Field of the Invention

The present invention relates to a solid-state imaging device, such as a CMOS solid-state imaging device. In particular, the present invention relates to a color solid-state imaging device using a color filter.

2. Description of the Related Art

In a solid-state imaging device used in an image sensor or the like, incident light can be collected into a light-receiving portion formed of photodiodes of respective pixels and then photo-electrically converted into signals.

The light-receiving portion formed of photodiodes has sensitivities at the wavelengths of the whole visual light, so that it may not directly obtain color information.

Thus, in the case of a color solid-state imaging device, color filters are installed. The color filters are, for example, those corresponding to the respective colors: Red, Green, and Blue (see, for example, Japanese Utility model Application Publication No. H04-94855; Japanese Utility Model Application Publication No. H04-94529; and Japanese Utility Model Application Publication No. S57-28362).

The most typical color array of a color filter is the Bayer array having four cells in a 2×2 pattern including one red cell, one blue cell, and two green cells.

Another color array is, for example, an array having four cells in a 2×2 pattern divided into four colors, cyan, yellow, magenta, and green using a complementary color filter.

The respective pure colors can be obtained by calculation of signals passing through color filters for the respective colors with a correction algorithm.

In general, a color filter is formed of a specific organic material having a suitable absorption and transmission properties (curve). For example, the color filter may be a pigment-containing resist or the like.

The use of the color filter has a disadvantage in that the color filter may not be a perfect wavelength filter. For instance, rays of light incident on a red cell may not completely become red light rays.

Therefore, correction algorisms have been designed so that more pure colors can be recovered from incident light through color filters for the respective colors. In addition, the overlap of the spectral characteristics of the color filters of the respective colors can be used to facilitate assumptions about pure colors. Therefore, a certain mixing result can be supplied under various conditions in which an image sensor is employed.

On the other hand, Japanese Unexamined Patent Application Publication No. 2004-103964 proposes, instead of using the color filters, a technique for separating colors from light lays using the fact that light rays of different colors differ in depth of absorption in silicon.

In other words, red light tends to permeate more deeply into the silicon than blue light.

This technique may not need any color filter because it can estimate the respective color components even without having any color filter.

However, in this technique, a disadvantage remains in color mixing. For example, when red light and green light pass through a layer that detects blue light, they may be absorbed in the layer to some extent. Therefore, a signal may be generated by the red or green light even when the blue light may not originally be present. As a result, a false signal may occur at a blue pixel.

Japanese Unexamined Patent Application Publication No. 2000-340776 discloses, for example, a structure including a color filter on the surface of photodiodes through an insulated film having the film thickness equivalent to that of a typical interlayer oxide film. When using the structure, however, color filter components in general may be decomposed in a typical semiconductor manufacture process. That is, the typical semiconductor manufacture process uses a high temperature gas having a high reactivity for a plasma deposition method. A typical color filter composes of organic dye material, whose molecules are large in size and decomposed in the typical semiconductor process.

Moreover, a typical color filter has a spectral characteristic in response to a bandpass of organic dye material. Light rays in a narrow wavelength range having a predetermined center wavelength can be transmitted through the filter according to the spectral characteristic. However, when the organic dye material is decomposed, a light transmission characteristic of the color filter including the organic dye material may be changed greatly to make the color filter unsuitable for use.

Further, when using such structure, it is difficult to apply a CMP (Chemical Mechanical Polishing) process used as a planarizing process. This is because the color filter may be broken in a CMP process carried out after forming the color filter. Therefore, a special planarizing process instead of a typical one becomes necessary.

Japanese Unexamined Patent Application Publication No. H11-027588 discloses a structure including an inactivation layer as a barrier layer formed of a silicon nitride film having the thickness of several hundreds μm above photodiodes so as to improve the response of the device including the photodiodes. According to this structure, moisture and oxygen that infiltrate into the surface of metal wires and photodiodes can be stopped and therefore, degradation of the characteristic of photodiodes due to such moisture and oxygen can be prevented.

However, it may be difficult to form an effective barrier layer formed of a silicon nitride film having a desired thickness on an uneven surface of the Si substrate, and there is a possibility that water molecules, oxygen or hydrogen may leak to substrate at a portion where the thickness of the layer is insufficient. In addition, since the silicon nitride film is formed in a high-temperature deposition process under 300° C. or more so as to obtain a high resistance as the barrier layer, the color filter formed before the silicon nitride film may be melted in the process.

SUMMARY OF THE INVENTION

A color filter is formed of a specific organic material as described above. Thus, the color filter has a small resistance to heat, impact, and so on, which can be directly encountered in the process typically carried out when a solid-state imaging device is manufactured. Therefore, the color filter is formed at comparatively late step, for example, the step immediately before the last step (e.g., the step of forming an on-chip lens) for completing the device.

Therefore, a disadvantage that may occur in the case where the silicon surface of the light-receiving portion and the color filter come extremely close to each other may be substantially prevented.

FIG. 1 is a schematic diagram (cross section view) of a CMOS solid-state imaging device using a color filter of related art. Light-receiving portions 52 made of photo diodes are formed in a semiconductor substrate 51 such as a silicon substrate. A multi-layered wiring layer 53 (in FIG. 1, including three layers) is formed above the semiconductor substrate 51. The wiring layer 53 is embedded in an insulating layer 55. Color filters 57 are formed on the insulating layer 55 through a planarizing layer 56, and an on-chip lens 59 is then formed thereon through a planarizing layer 58. Furthermore, a low-reflecting coating 54 is formed directly above the light-receiving portions 52.

Respective pixels include the color filters 57, that is, red color filters 57(R) and green color filters 57(G) formed above the light-receiving portions 52. In addition, blue color filters are formed on other pixels provided on the cross section part not shown in the figure.

Therefore, with respect to the color filter 57, color filters of the respective colors are arranged according to a color array, such as the Bayer array.

FIG. 2 is a schematic cross section diagram showing the configuration of another CMOS solid-state imaging device of related art. In other words, FIG. 2 illustrates the cross section view of a single pixel.

The configuration of the pixel shown in FIG. 2 further includes inner-layer lenses 61 (61A, 61B) having upwardly-convexed surfaces between the silicon surface of the light-receiving portion 52 and the planarizing layer 56 below the color filter 57. The inner-layer lenses 61 enhance the power of collecting incident light rays.

In the respective configurations shown in FIG. 1 and FIG. 2, the color filters 57 are formed on a comparatively upper portion because of forming the color filters 57 prior to the step of forming the on-chip lens 59.

In this case, however, since the color filters 57 is formed on the comparatively upper portion, the distance (height) from the light-receiving portion 52 to the color filters 57 may be extended. In particular, as shown in FIG. 1 and FIG. 2, a significant increase in such a distance can be observed in a CMOS solid-state imaging device in which the multi-layered wiring layer 53 including a number of layers is formed in an imaging region.

The fact indicates an increase in chance of allowing light rays passing through the color filter 57 at one pixel to leak and enter into the next pixel.

For example, the red light rays leak and enter into green and blue pixels, followed by imparting an unnatural number of electrons to the light-receiving portions 52 below the respective color filters 57. As a result, the device may show a decrease in ability of correctly expressing a pure color. In other words, the device may cause the color-mixing and color drift.

It seems that the use of a suitable algorithm may correct the above light-leakage. However, it is only attained when the light-leakage is constant in all ranges of the settings of lenses connected to the device, aperture, and so on.

The amount of light-leakage may vary depending on the external settings of lens, aperture, and so on. Thus, the correction with the algorithm may be difficult. Therefore, a trade-off may occur between the acquisition of an image with favorable color reproducibility and convenient ranges of lens and aperture.

Furthermore, a progress in miniaturization of a solid-state imaging device leads to a decrease in size of each pixel and narrowing pitches of electrodes and interconnections.

Consequently, the aperture on the light-receiving portion 52 becomes small. Thus, oblique incident light rays tend to be blocked by the electrodes and the interconnections, so that the light rays may be hardly incident on the light-receiving portion 52. As a result, an undesired phenomenon, such as shading, may occur.

It is desirable to provide a solid-state imaging device including an optical filter layer with which a color filter or other optical filter layers may be provided close to the light-receiving portion, compared with that of the related art.

According to an embodiment of the present invention, there is provided a solid-state imaging device including: a light-receiving portion, an optical filter layer, and quantum dots. The light-receiving portion, where a photoelectric conversion is carried out, is formed in a semiconductor substrate. The optical filter layer is directly formed on or formed through another layer on the surface of the semiconductor substrate in which the light-receiving portion is formed. The quantum dots having substantially equal diameters are formed in the optical filter layer. The quantum dots have higher refractive indexes than the refractive index of the layer in which the quantum dots are embedded.

According to the configuration of the solid-state imaging device of the embodiment of the present invention, as described above, the optical filter layer is directly formed on or formed through another layer on the surface of the semiconductor substrate in which the light-receiving portion is formed. Thus, the optical filter layer can constitute a color filter through which visible light in a predetermined range of wavelengths can pass or an optical filter through which infrared light, visible light, or ultraviolet light in a predetermined range of wavelengths can pass. Quantum dots having substantially equal diameters are formed in the optical filter layer. The quantum dots have higher refractive indexes than the refractive index of the layer in which the quantum dots are embedded. The quantum dots having higher refractive indexes than the refractive index of the quantum-dot-embedded layer, so that the optical filter layer can be provided with optical characteristics of transmitting light in a predetermined range of wavelengths.

According to the above embodiment of the present invention, the quantum dots having higher refractive indexes than the refractive index of the quantum-dot-embedded layer and having substantially equal diameters allow the optical filter layer to have optical characteristics of transmitting light in a predetermined range of wavelengths. Therefore, an optical filter layer can be formed without the use of an organic material which is comparatively weak in process damage, such as thermal or etching damage.

Consequently, a solid optical filter layer having a process-damage resistance can be provided. In the manufacture, therefore, the characteristics of the optical filter can be protected from adverse effects in the manufacturing process subsequent to the process of forming the optical filter layer.

As a result, the optical filter layer can be provided at a position (height) close to the surface of the semiconductor substrate in which the light-receiving portion is formed.

As described above, the optical filter layer is provided at a position close to the surface of the semiconductor substrate. Thus, when oblique incident light or leaked incident light is incident on adjacent pixels, the light incident on the adjacent pixel passes through the optical filter layer. Therefore, the configuration of the solid-state imaging device of the embodiment of the present invention can prevent the generation of color drift and color mixing, which have been caused in the configuration of the solid-state imaging device of the related art.

In other words, for example, even if the distance from the on-chip lens to the light-receiving portion increases, or for example, if the F value of an external lens becomes less than 2.6, it is possible to prevent the generation of color drift and color mixing.

Furthermore, the use of the quantum dot structure allows an optical filter layer to be configured solid as described above because only a single material system may be used in the manufacture of plural kinds of optical filters having different optical characteristics, such as color filters of the respective colors. In addition, the use of the quantum dot structure allows characteristics of the optical filter layer to be sequentially changed by controlling the diameters of quantum dots. Accordingly, the degree of freedom in the optical filter design can be extensively extended, compared with the optical filter of the related art. That is, the optical characteristics of the typical optical filter have been determined by the inherent optical characteristics of a filter material (e.g., dye or pigment in resist).

BRIEF DESCRIPTION OF THE DRAWINGS

FIG. 9A and FIG. 9B show the structures of different pixels, respectively.

FIGS. 10A to 10C are cross section views of a single pixel in the partially modified configuration of the solid-state imaging device shown in FIG. 4, where FIG. 10A, FIG. 10B, and FIG. 10C show the structures of different pixels, respectively.

FIG. 11A and FIG. 11C show the structures of different pixels, respectively.

FIG. 14A and FIG. 14B show the structures of different pixels, respectively.

FIG. 15A and FIG. 15B show the structures of different pixels, respectively.

DESCRIPTION OF THE PREFERRED EMBODIMENTS

First, prior to the description of the preferred embodiment of the present invention, the outline of the present invention will be described.

According to an embodiment of the present invention, a solid-state imaging device includes an optical filter layer directly formed on or formed through another layer (e.g., an insulating layer or a low-reflecting coating) on the surface of the semiconductor substrate in which a light-receiving portion is formed. Here, quantum dots having substantially equal diameters are formed in a layer.

The quantum dots used may be, for example, silicon dots.

The layer in which quantum dots are formed is preferably a layer having insulation properties and a lower refractive index than the refractive indexes of the quantum dots. The layer may be, for example, a $SiO_2$ layer or a $Si_3N_4$ layer.

With respect to the silicon dots, researchers have conducted experiments mainly in the field of experimental memory systems (see, for example, Y. Hirano et al., Proceedings of the Institute of Image Information and Television Engineers (ITE) Annual Convention, 13-5, 2004).

In addition, an example of the use of quantum dots in a more common electric memory device has also been proposed.

In those examples, in order to form silicon dots, extreme methods are adopted rather. However, it is preferred to adopt a simplified method. The above literatures have reported the use of silicon dots being completely placed at intervals. The above literatures have insisted that such an arrangement of silicon dots could increase the efficiency of photoconductivity.

However, rather than the characteristics of silicon dots, the above-described effects may purely depend on optical scattering in the quantum dot layer. In this example, the space between the dots is more important.

In contrast, according to an embodiment of the present invention, the quantum dots themselves, such as silicon dots, determine the characteristics of optical filter layer.

The diameters of the quantum dots may change to alter the optical characteristics of the optical filter layer, specifically the wavelength of the absorption end.

Consequently, the optical characteristics of the optical filter layer can be effectively, sequentially adjusted so as to correspond to the various required ranges of wavelengths.

Specifically, the smaller the diameters of the quantum dots become, the broader the wavelength range of light passing through the optical layer extends to the short wavelength side.

Figure 3:
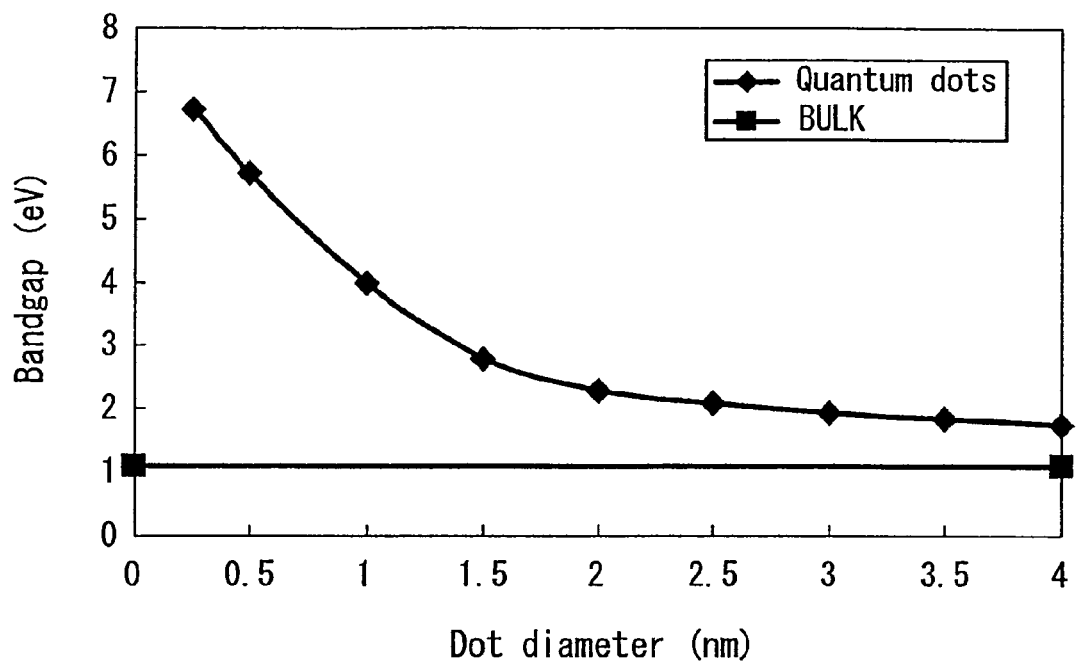
FIG. 3 is a graphical representation of a relationship between diameters of silicon quantum dots and optical bandgap.

FIG. 3 shows a relationship between the diameter of silicon quantum dot and the optical bandgap. As shown in FIG. 3, the optical bandgap values of silicon bulk are represented for comparison. The size of the bandgap shown in FIG. 3 is directly related to the wavelength of the absorption end.

As shown in FIG. 3, it is found that the smaller the diameters of the quantum dots become the larger the bandgaps become. In addition, it is found that variations of bandgaps become large when the diameters of the quantum dots become approximately 1.5 nm or less.

This figure may be used in designing of the desired configuration of the optical filter layer.

A color filter can be formed by adjusting the optical characteristics of the optical filter layer to allow visible light in the predetermined range of wavelength to pass through such a layer.

In addition, an optical filter layer through which part of ultraviolet light rays passes can be formed.

Three types of method of producing quantum dots are proposed and described as following.

The first method applies an etching method. A silicon layer having a desired thickness so as to form quantum dots that act as a color filter is deposited, through an insulated film such as a $SiO_2$ film, on a semiconductor substrate, in which light-receiving portions are formed. Subsequently, the deposited silicon layer is etched by a mask acted as a photoresist to form an island silicon film. Then a $SiO_2$ film is grown on the island silicon film so as to obtain a single quantum-dot layer.

Repeating the process of deposition of silicon layer, etching and growth of $SiO_2$ film may produce a three-dimensional quantum dot structure, therefore forming a color filter.

In this method, position or width of the opening in the mask can be controlled when etching, and therefore position or diameters of quantum dots can also be easily controlled. Consequently, quantum dots may be formed in desired places. Moreover, when forming a plurality of quantum dot layers, it is possible to form different positions among quantum dot layers by differentiating positions of the opening in the masks. For example, quantum dots are formed in the same place every other layer.

The second method of producing quantum dots is described hereafter. After a $SiO_2$ film and a silicon film are sequentially deposited on the semiconductor substrate comprising of light-receiving portions, the surface of the silicon film is oxidized while the temperature is being raised. The silicon film is decomposed by such process, and silicon may become an island layer surrounded by $SiO_2$. Therefore, the silicon quantum dots can be produced.

The sizes of dots are controlled by appropriately selecting parameters in the annealing process and the thickness of the silicon layer. In addition, other $SiO_2$ film and silicon film are sequentially deposited thereon. Then the surface of the silicon film is oxidized while the temperature is being raised. Such processes are repeated on respective light-receiving portions for the same color. As a result, a three-dimensional quantum dot structure can be formed.

This process is comparatively short in time in manufacturing color filters. Moreover, masks are not required and quantum dots can be formed in random positions.

Nevertheless, it is also possible to form the three-dimensional quantum dot structure by an overall annealing after $SiO_2$ films and thin silicon films are deposited on each other. The overall annealing is able to reduce the process time while a layer-by-layer annealing is able to be conducted in comparatively low temperatures.

Types of color filters (for example, red, green and blue), which are decided by the diameters (or sizes) of quantum dots, will be discussed later.

In the second method, the diameters of quantum dots are decided by original (i.e. before deposition and annealing) thickness of silicon films and annealing parameters. Therefore, for instance, varied original thickness of silicon films will produce different diameters of quantum dots despite that the annealing process is conducted for the same period of time or under same annealing parameters. This enables the manufacturing of various types of color filters.

The third method is described hereafter.

When a $SiO_2$ layer of $Si_3N_4$ layer is being deposited, it is usually conducted within an atmosphere of mixed gas, which is mixed by a certain proportion of silane gas and oxygen gas or nitrogen gas. By the way, it is preferable to apply more silane in the gas than common, i.e. silane-rich gas when depositing. A silicon film formed with the silane-rich mixed gas after depositing the filter layer is subjected to a low-temperature annealing for a short period of time, with the result that excessive Si condenses as silicon islands. By controlling the concentration of Si (i.e. proportion of Si to oxygen or nitrogen, mixture proportion of mixed gas) and parameters in annealing (temperature setting, pressure, etc.), the diameters of quantum dots may be controlled to form filters for the three colors, respectively.

This process is comparatively short in time in manufacturing color filters. Moreover, masks are not required and quantum dots can be formed in random positions.

The diameters of the quantum dots are preferably in the range of 0.5 nm to 10 nm. When having the diameters within this range, the quantum dots having substantially equal diameters can be readily formed.

Figure 1:
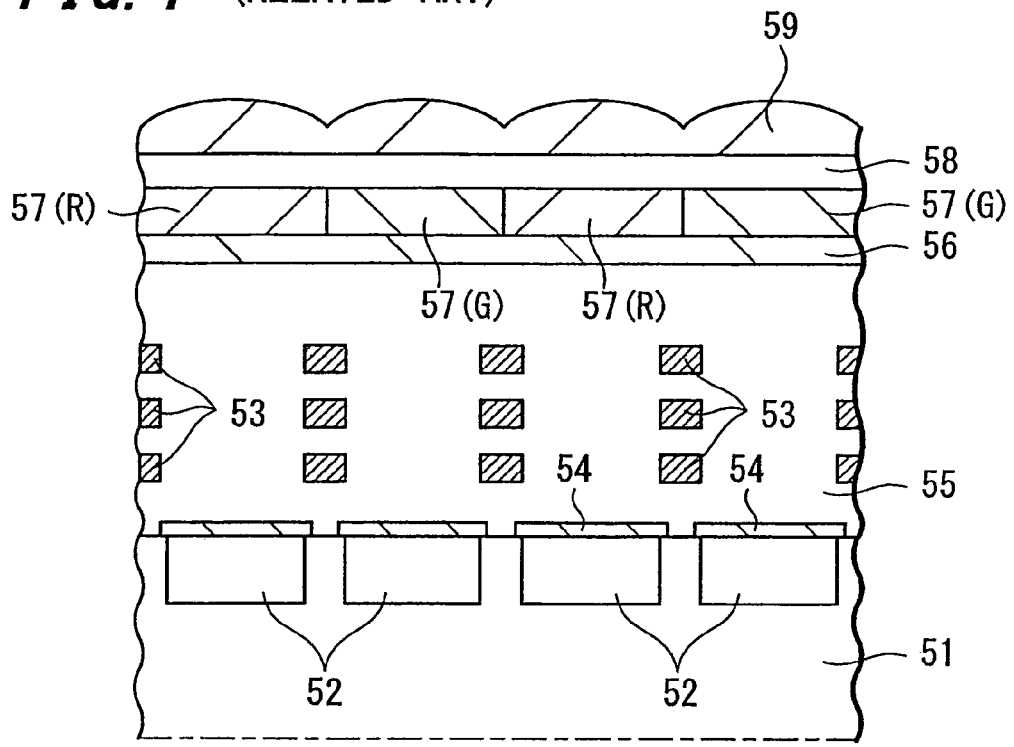
FIG. 1 is a schematic diagram (cross section view) of a CMOS solid-state imaging device using a color filter according to related art.
Figure 2:
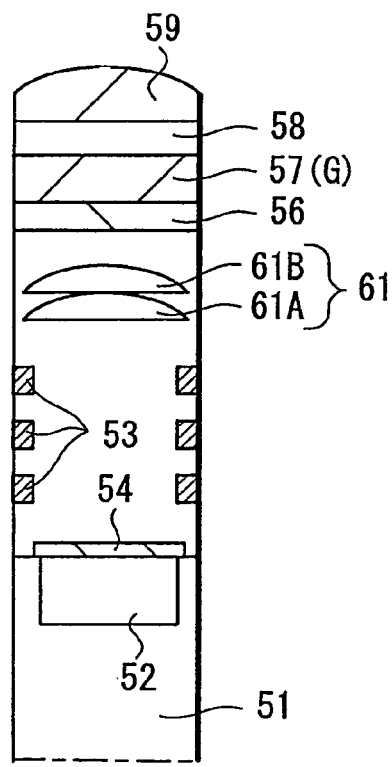
FIG. 2 is a schematic diagram (cross section view) of a CMOS solid-state imaging device using an inner-layer lens and a color filter according to related art.

The optical filter layer using the quantum dots can be used in combination with an optical coupling layer for reducing a surface reflection. For instance, the optical filter layer may be stacked with a typically-used refractive index matching layer (low-reflecting coating 54 shown in FIG. 1, or the like). These stacked layers may act as a refractive index matching and filter region. Since the refractive index matching and filter region can be formed as described above, light rays can be prevented from leaking from the lower part of the filter layer to the adjacent cell. In addition, only a change in one of the standard structures may lead to the restriction of color mixing between pixels.

The optical filter layer formed with the quantum dots may require a sufficiently large absorption to sufficiently lower the light at an undesired wavelength to a non-problematic level.

Not only the thickness of the layer but also the balance between the thickness of the layer and the concentration of dots in the layer determines the fact described above.

The layer may be required to be thin for allowing the light at desired range of wavelengths to sufficiently pass through the layer, as the concentration of the dots increases. However, if the concentration of dots increases, assemblies having comparatively various sizes may be formed, which is undesirable. Thus, when assemblies with various sizes are formed, the quality of the filter layer may be degraded and the use thereof will be limited further.

In contrast, the layer may be required to be thick to some extent to allow the filter characteristics to act, as the concentration of dots decreases.

When an experiment of silicon dots is conducted, it is found that a filter action works favorably when the dot concentration is approximately $1 \times 10^5/\mu m^2$ and even higher concentration also leads to such an action. On the other hand, if the concentration of dots is $1 \times 10^3/\mu m^2$ or less, there may be a need of a substantial increase in thickness to make the filter action to be used. The concentration of quantum dots is preferably in the range of $1 \times 10^3/\mu m^2$ to $1 \times 10^7/\mu m^2$ to allow the film with an appropriate thickness to work the film action.

The thickness of the optical filter layer is preferably in the range of 100 nm to 2 µm (2,000 nm) depending on the concentration of the dots.

Hereinafter, specific embodiments of the present invention will be described.

Figure 4:
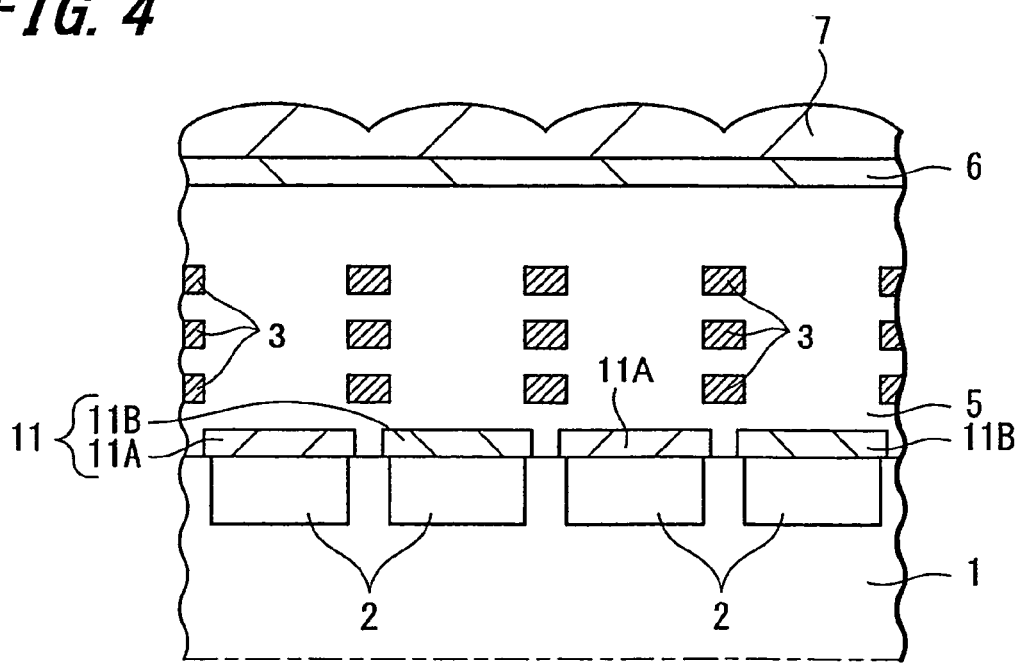
FIG. 4 is a schematic diagram (cross section view) of a solid-state imaging device according to an embodiment of the present invention.

FIG. 4 shows the schematic configuration of a solid-state imaging device according to an embodiment of the present invention. In other words, the present embodiment is a case where the present invention is applied on a CMOS color image sensor.

A solid-state imaging device 10 includes light-receiving portions 2, each formed of a photodiode, formed in a semiconductor substrate 1, such as a silicon substrate. In addition, a multilayered wiring layer 3 (including three layers in FIG. 4) is formed above the semiconductor substrate 1. The wiring layer 3 is embedded in an insulating layer 5.

Furthermore, an on-chip lens 7 is formed on the insulating layer 5 through a planarizing layer 6. The solid-state imaging device 10 is thus formed.

In the solid-state imaging device 10 according to the embodiment, particularly, color filters 11 (11A, 11B) are directly mounted on the surface of the semiconductor substrate 1. The color filters 11 include plural kinds of color filters having different optical characteristics (11A, 11B, and other color filters not shown in the figure), respectively.

Furthermore, in the solid-state imaging device 10 of the present embodiment, each color filter 11 is formed using the above-described quantum dots.

Figure 5A:
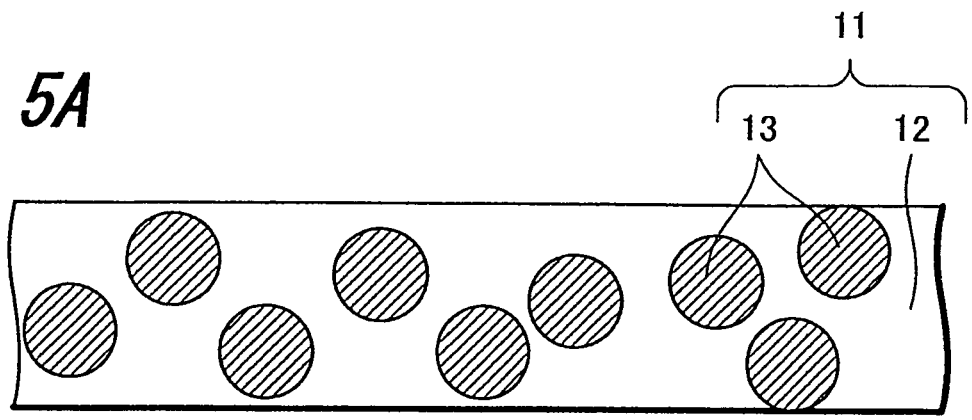
FIGS. 5A to 5C are schematic diagrams (cross section views) showing respective structures of a color filter shown in FIG. 4.
Figure 5B:
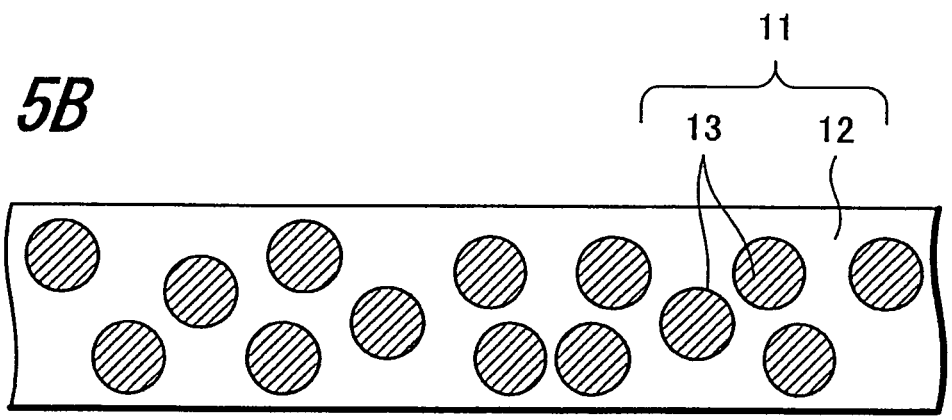
Figure 5C:
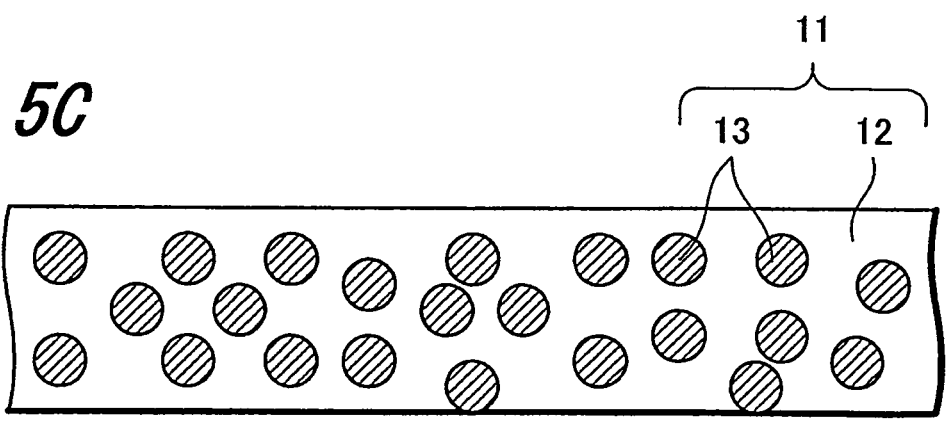

FIGS. 5A to 5C are cross section views illustrating specific exemplified structures of the color filters 11 shown in FIG. 4, respectively. In each structure, the color filter 11 is formed such that quantum dots 13 with equal diameters, such as silicon dots, are formed in a layer 12 having insulation properties and a low refractive index, such as a SiO$_2$ layer.

FIG. 5A shows the quantum dots 13 having comparatively large diameters. FIG. 5B shows the quantum dots 13 having smaller diameters. FIG. 5C shows the quantum dots 13 having more smaller diameters. In this way, variations in diameters of the quantum dots 13 enable variations in optical characteristics of the color filters 11 to be obtained. Specifically, the smaller the diameters of the quantum dots 13 become, the broader the range of optical wavelengths of light passing through the color filters 11 extends to the short wavelength side.

Note that, as a mode of the arrangement of color filters, part of pixels may be only provided with a layer 12 having insulation properties and a low refractive index instead of the color filter 11 using the quantum dots 13 as shown in FIGS. 5A to 5C. In other words, the layer in the absence of quantum dots 13 may be arranged. In this case, the layer 12 with a low refractive index may not work as a filter but it may constitute a pixel on which both infrared light and visual light can be incident.

Furthermore, the solid-state imaging device 10 may be used in combination with an external IR filter (infrared-light cut filter) so that the whole wavelength regions of visible light can be incident on a pixel, excluding infrared light. A large number of cameras that employ a CMOS solid-state imaging device and a CCD solid-state imaging device include the IR filter fixed on the most upper part in the packaging process of an image sensor to restrict an infrared portion not visible in the spectrum.

Next, an embodiment of the arrangement of color filters 11 will be described.

For preparing a color image sensor, at least three different filters may be installed.

Figure 6:
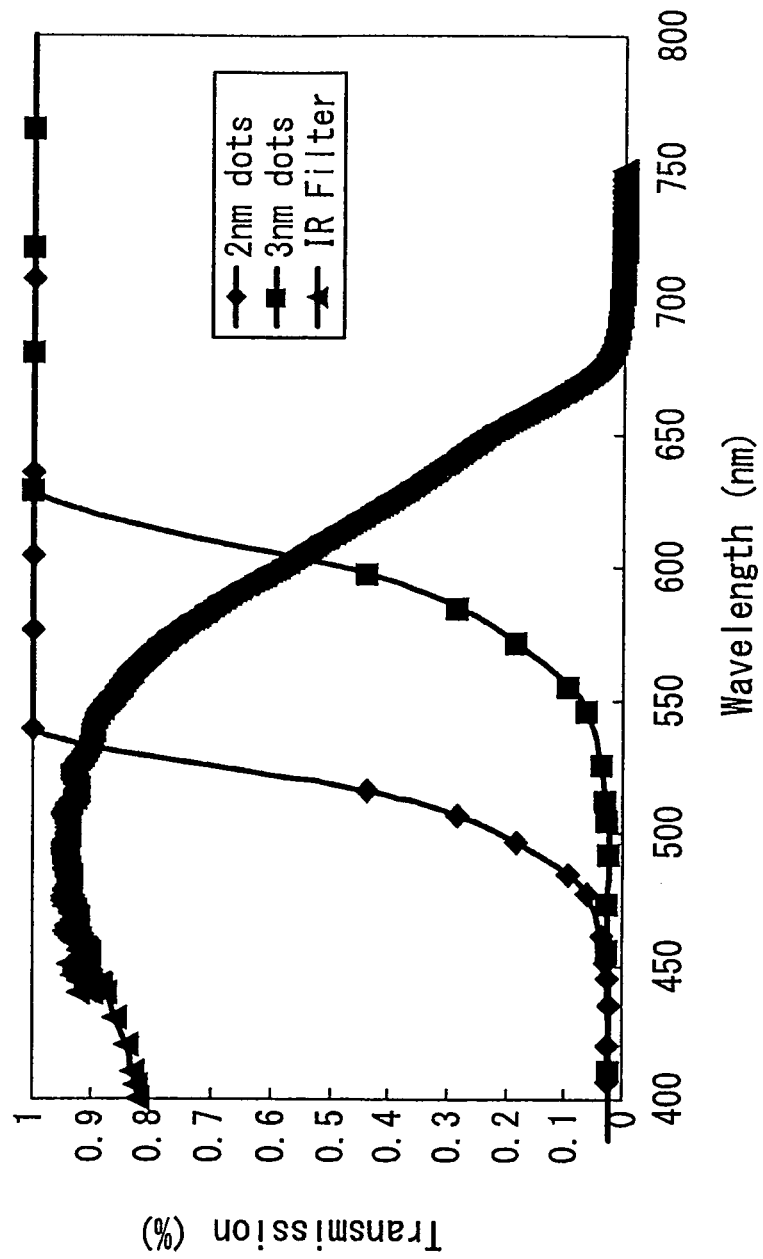
FIG. 6 is a graphical representation of the wavelength distribution of a color filter.

FIG. 6 shows a wavelength distribution of the color filter 11 when the dot diameter is 2 nm and a wavelength distribution of the color filter 11 when the dot diameter is 3 nm respectively, in the case of forming silicon dots as quantum dots 13. FIG. 6 also shows the wavelength distribution of the external IR filter of the solid-state imaging device 10.

As shown in FIG. 6, light at wavelengths of approximately 500 nm and more can be transmitted when the dot diameter is 2 nm. Light at wavelengths of approximately 570 nm and more can be transmitted when the dot diameter is 3 nm. Furthermore, the color filters with these dots may be used in combination with the external IR filters. Such a combination allows the formation of a pixel in which light at wavelengths of 500 nm to 650 nm is transmitted and a pixel in which light at wavelengths of 570 nm to 650 nm is transmitted.

Here, the distribution shown in FIG. 6 is used in the formation of 2×2 unit cells as an embodiment of the arrangement of color filters 11. As shown in a plan view of FIG. 7, the 2×2 unit cell includes one cell for red (570 nm to 650 nm), two cells for red+green (500 nm to 650 nm), and one cell for red+green+blue (400 nm to 650 nm).

The cell (red) includes a color filter 11A in which the silicon dots 13 have a diameter of 3 nm. The cell (red+green) includes a color filter 11B in which the silicon dots 13 have a diameter of 2 nm. The cell (red+green+blue) includes a color filter 11C only formed of a layer 12 having a low refractive index in the absence of silicon dots 13. The cells (red+green) 11B are arranged in a checkered pattern. Then, the cells (red) 11A and the cells (red+green+blue) 11C are arranged every other line in the remaining pixels, respectively.

Thus, the color filters 11 (11A, 11B, 11C) can be arranged in this way to restore a pure color with an appropriate algorithm. The color filters 11 are different from typical color filters in the past where the transmissive wavelengths thereof correspond to only one of red, green, and blue. Accordingly, the algorithm for this embodiment may not be completely the same as that of the typical one. In the arrangement shown in FIG. 7, however, color signals can be restored using a comparatively simplified algorithm.

Next, another embodiment of the arrangement of color filters 11 will be described.

According to the embodiment, a filter for removing the influence of ultraviolet light which may unnaturally increase a blue hue of a shot image is used. The filter may be a color filter 11 having fine quantum dots 13 each having a diameter of 1.2 nm.

Figure 8:
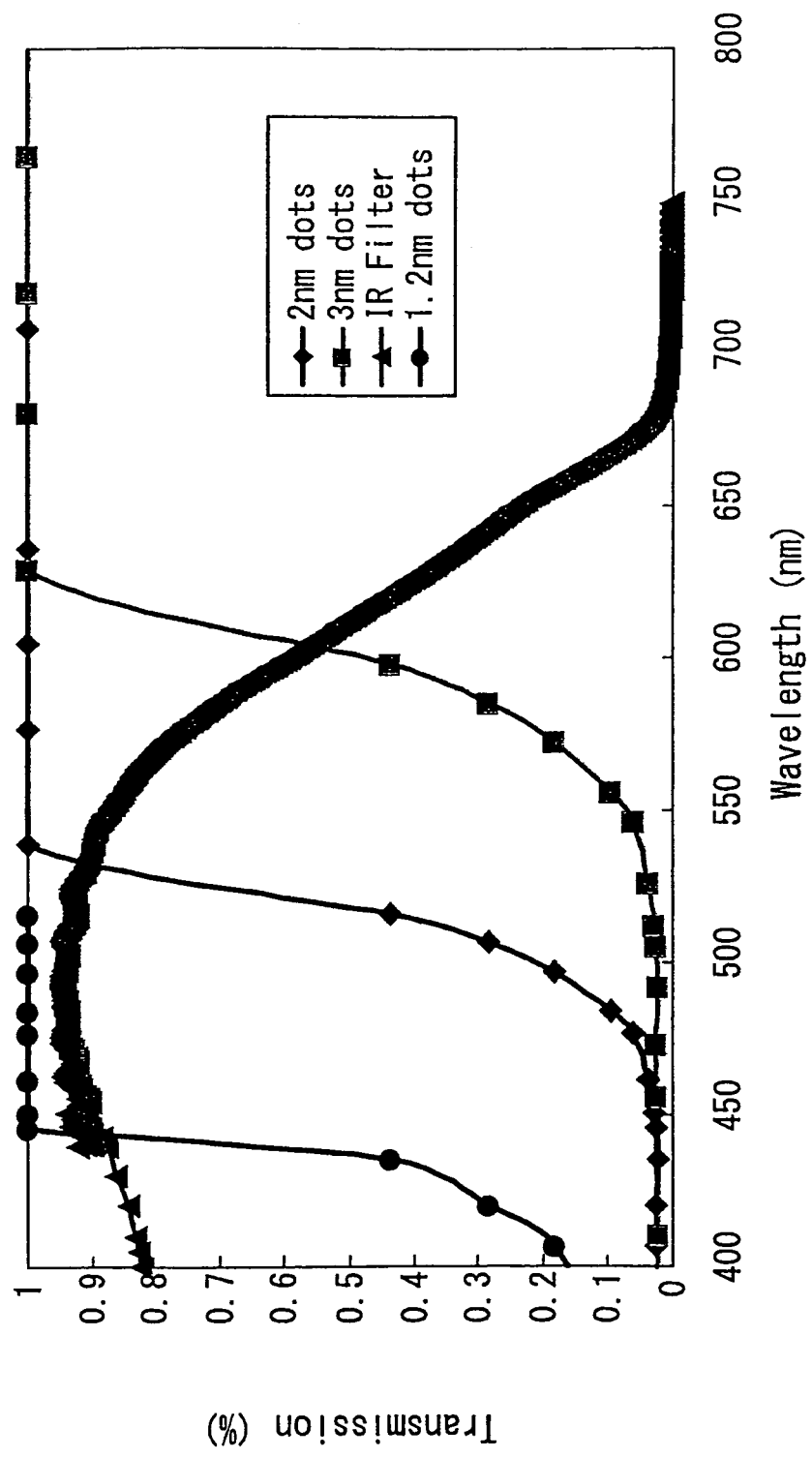
FIG. 8 is a graphical representation of the wavelength distribution of a color filter using quantum dots with diameters of 1.2 nm in addition to the wavelength distribution shown in FIG. 6.

FIG. 8 shows the wavelength distribution shown in FIG. 6 in which a wavelength distribution obtained using the quantum dots 13 each having a diameter of 1.2 nm is further superimposed.

As shown in FIG. 8, when the dot diameter is 1.2 nm, light at a wavelength of approximately 400 nm or more can be transmitted. In addition, when using the color filter in combination with an external IR filter, a pixel for passing through light in a wavelength region of 400 nm to 650 nm can be formed.

Figure 7:
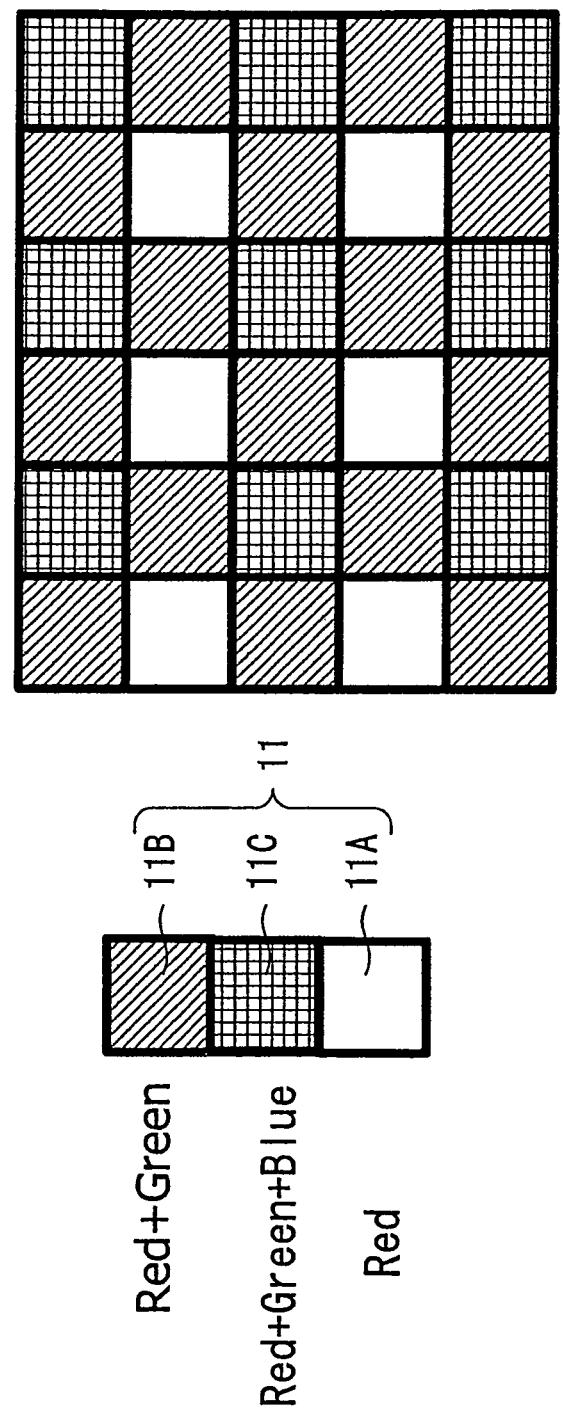
FIG. 7 is a plan view illustrating an embodiment of a color filter shown in FIG. 4.

According to the embodiment, the dot distribution shown in FIG. 8 can be employed to arrange three or four different color filters (not shown). In the arrangement of three different color filters 11A, 11B, and 11C shown in FIG. 7, an additional color filter with a diameter of 1.2 nm may be installed replacing the filter 11C having no dot. Thus, another arrangement of three different color filters can be obtained. Alternatively, if the filter 11C having no dot remains as it is, the arrangement of four different color filters can be obtained. In the case of three different color filters, the same plan arrangement as one shown in FIG. 7 may be employed. If four different color filters are used, another plan arrangement, which is different from one shown in FIG. 7, is employed.

When the solid-state imaging device 10 according to the embodiment is produced, masks or the like are used to form three or four different color filters one by one in order. Furthermore, a color filter is removed from an undesired portion, so that the color filter 11 will finally remain on the light-receiving portions 2.

According to the configuration of the solid-state imaging device 10 of the embodiment as described above, color filters 11 (11A, 11B) are directly formed on the surface of the semiconductor substrate 1 in which light-receiving portions 2 are formed.

Therefore, even if light is incident on adjacent pixels as a result of oblique incident light or leaked light, the light can pass through the color filters 11 after entering into the adjacent pixel. Therefore, the generation of color drift and color mixing, which have been caused in the typical configuration of the device, can be prevented.

Therefore, even if the distance from the on-chip lens 7 to the light-receiving portion 2 increases as a result of an increase in the number of wiring layers, or the F value of an external lens is less than 2.6, the generation of color drift and color mixing can be prevented.

Furthermore, the color filter 11 includes quantum dots 13, so that the film characteristics thereof can be controlled by adjusting the diameters of quantum dots 13 while the resistance thereof to process damage can be increased.

An increase in process-damage resistance of the color filter 11 prevents the color filter 11 from being damaged even if the color filter 11 is provided at a position close to the semiconductor substrate 1 as shown in FIG. 4. The color filter may be damaged due to impacts of heat, etching damage, and so on caused in the process of forming each of upper layers (e.g., the insulating layer 5) without such process-damage resistance. Therefore, as shown in FIG. 4, the color filter 11 is provided at a position close to the semiconductor substrate 1 to prevent the generation of color drift and color mixing.

Furthermore, according to the embodiment, color filters having different filter characteristics may be formed by changing the diameters of quantum dots 13 alone, while using the same material for the color filters 11. Therefore, the color filters of the embodiment have various advantages in comparison with the typical color filters in which the filter characteristics thereof have been changed by differences in materials, such as dyes and pigments. For instance, the process of producing color filters may not require any expensive material. Besides, the process avoids uneven optical and chemical characteristics and reduces the difference between the production conditions of the respective color filters. Therefore, the production process can be simplified.

Typical color filters in the past have filter characteristics defined by inherent optical characteristics of filter materials (e.g., dyes, colorants, and pigments in resist). Thus, the color filters have been selected based on their limited, discontinuous filter characteristics.

In contrast, the color filters 11 used in the present embodiment may continuously change their wavelengths of absorption ends by changing the diameters of quantum dots 13. Therefore, the absorption edge wavelength can be continuously changed. As a result, the design freedom of color filters 11 can be widely extended.

Figure 9A:
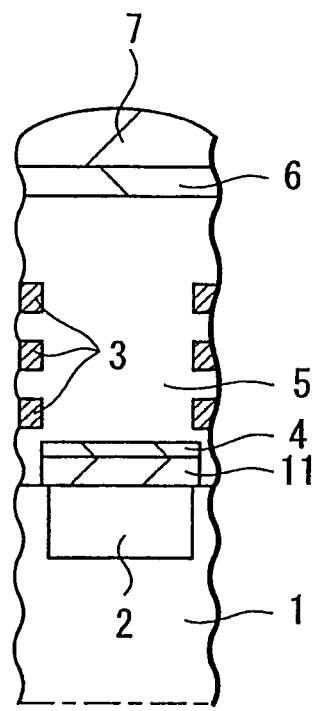
FIGS. 9A and 9B are cross section views of a single pixel in the partially modified configuration of the solid-state imaging device shown in FIG. 4, where
Figure 9B:
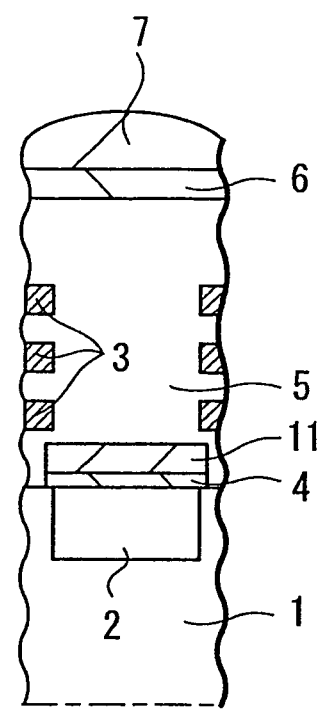

Next, FIGS. 9A and 9B respectively show the partially modified structures of the solid-state imaging device 10 shown in FIG. 4 according to another embodiment. FIGS. 9A and 9B are cross section views each corresponding to a single pixel, respectively.

In these structures, a low-reflecting coating 4 is provided as an optical coupling layer on the upper or lower layer of the color filter 11 shown in FIG. 4. In the structure shown in FIG. 9A, the low-reflecting coating 4 is mounted on the color filter 11. In the structure shown in FIG. 9B, the low-reflecting coating 4 is provided between the underside of the color filter 11 and the semiconductor substrate 1.

The material of the low-reflecting coating 4 may be, for example, SiN or SiON.

In particular, the structure shown in FIG. 9B is restricted to be used in lowering the refractive index to almost a level between those of the low-reflecting coating 4 and the insulating layer 5. In contrast, the structure of FIG. 9B requires a sufficient decrease in concentration of quantum dots in the color filter 11 to lower the refractive index. Therefore, the filter characteristics of the color filter 11 may lose steepness. For instance, the wavelength distribution shows a gentle slope of the rising edge, compared with the wavelength distribution shown in FIG. 6 or FIG. 8.

Next, FIGS. 10A to 10C respectively show the partially modified structures of the solid-state imaging device 10 shown in FIG. 4 according to another embodiment. FIGS. 10A to 10C are cross section views each corresponding to a single pixel, respectively.

As shown in FIGS. 10A to 10C, an inner-layer lens 8 composed of two convex lenses 8A and 8B having upwardly-convexed surfaces are provided in the insulating layer 5 above the color filter 11. The respective structures of FIGS. 10A to 10C are formed so that the respective structures shown in FIG. 4, FIG. 9A, and FIG. 9B are provided with inner-layer lenses 8, respectively.

The material of the inner-layer lens B may be a material having a higher refractive index than that of the surrounding insulating layer 5, for example, a silicon nitride (SiN).

Light rays incident on the respective pixels can be converged and efficiently incident on the light-receiving portion 2 by providing the structure with the inner-layer lenses 8 (8A, 8B). Consequently, the sensitivity of the pixel can be increased, compared with the structure without the inner-layer lens 8.

The number of lenses that constitutes the inner-layer lens is not limited to two. It may be one, or three or more. In addition, the convex surface of the lens may face downward.

Figure 11A:
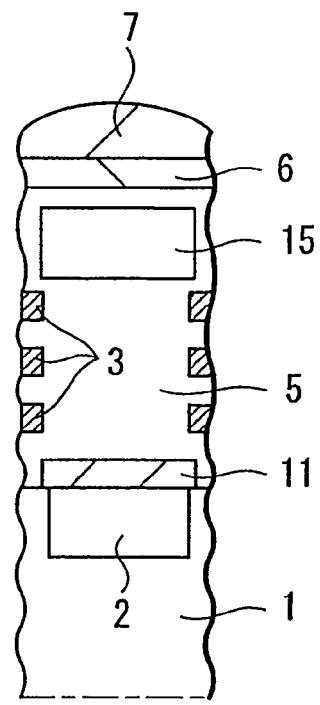
FIGS. 11A and 11B are cross section views of a single pixel in the partially modified configuration of the solid-state imaging device in FIG. 4, where
Figure 11B:
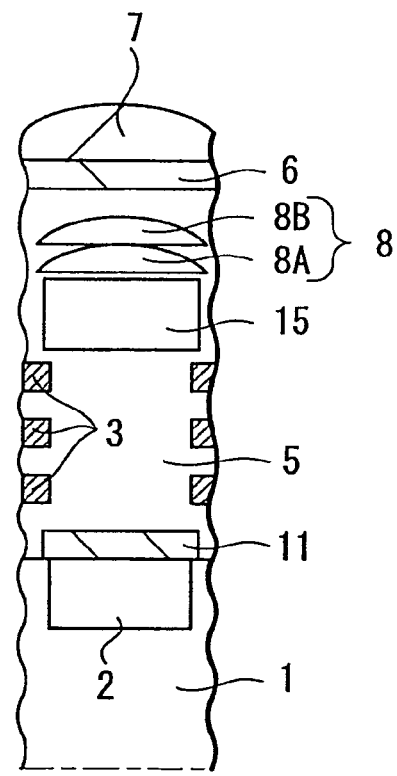

Furthermore, FIGS. 11A and 11B respectively show the partially modified structures of the solid-state imaging device 10 shown in FIG. 4 according to another embodiment. FIGS. 11A and 11B illustrate cross section views each corresponding to a single pixel. In each of these structures, an IR filter (infrared ray cut filter) usually provided outside is incorporated in the device structure itself. In each structure, an IR filter 15 is formed in the insulating layer 5 which is upper than the wiring layer 3. In particular, in the structure shown in FIG. 11B, the IR filter is arranged at the height between the inner-layer lenses 8 (8A, 8B) and the wiring layer 3.

Figure 12:
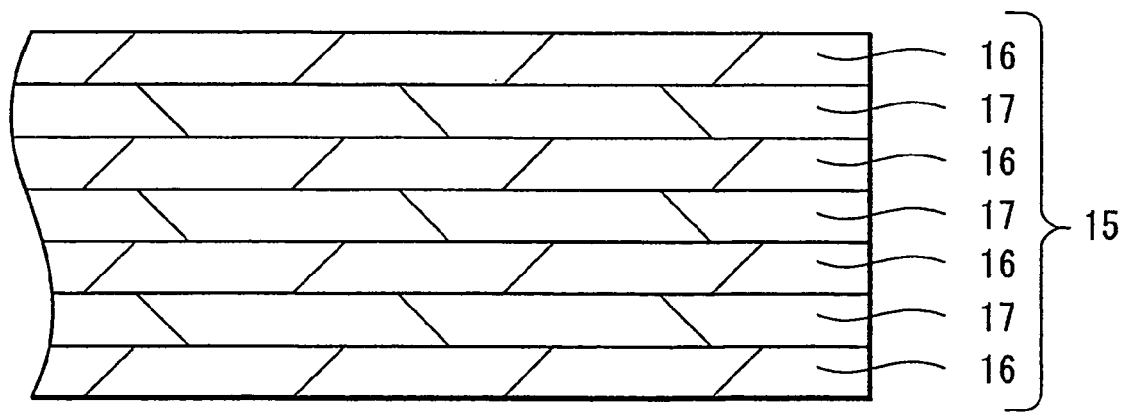
FIG. 12 is a cross section view of an embodiment of a dielectric multilayer that constitutes each of IR filters of FIGS. 11A and 11B.

The IR filter 15 is formed of a dielectric multilayer. FIG. 12 illustrates a cross section view of the electric multilayer according to an embodiment. In the structure shown in FIG. 12, the IR filter 15 is formed of a dielectric multilayer including first films 16 and second films 17 which are alternately stacked in total of seven stacked films. For instance, the dielectric multilayer may be formed such that the first film 16 is made of $SiO_2$ and the second film 17 is made of SiN.

Figure 13:
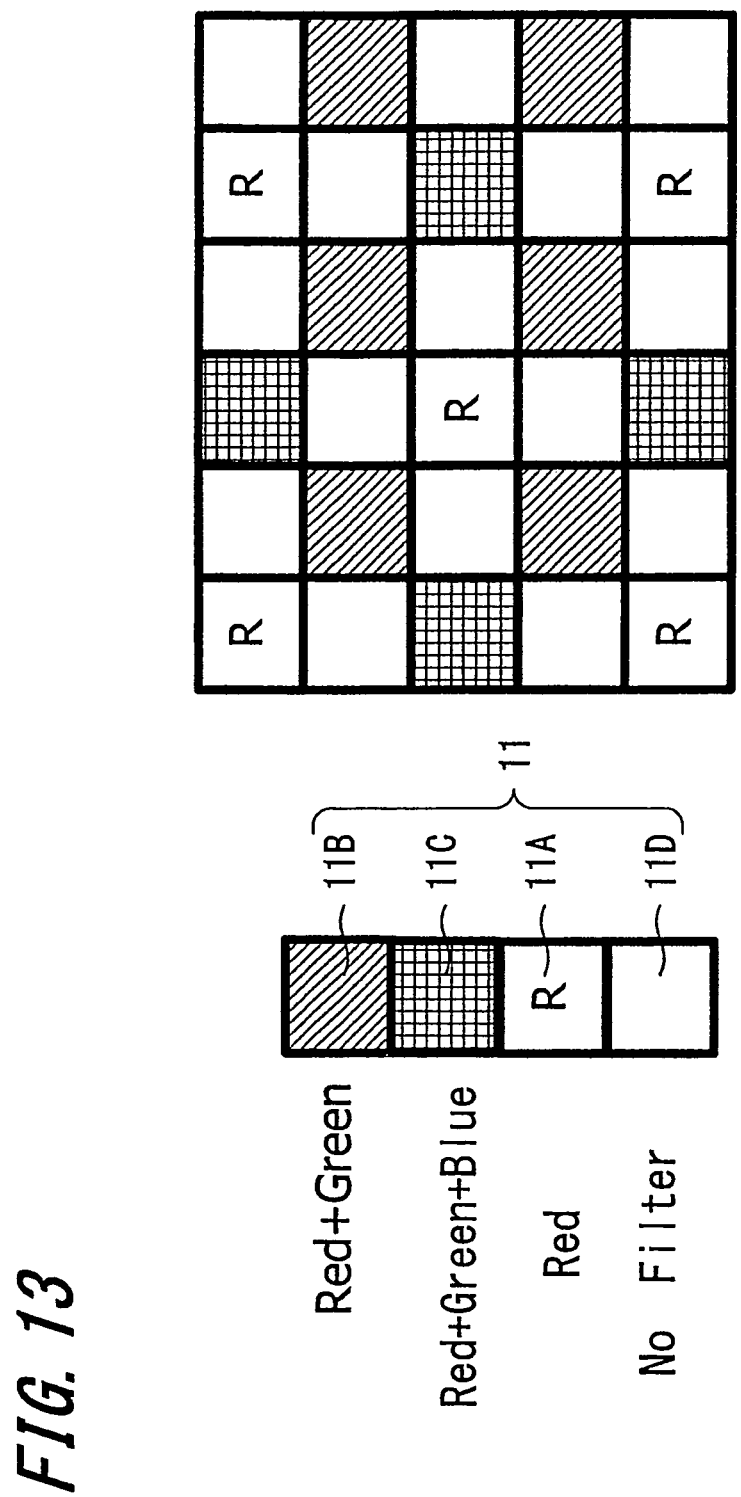
FIG. 13 is a plan view of an embodiment of a color filter arrangement in FIGS. 11A and 11B.

In the case where the IR filter 15 is formed as described above, the filter arrangement of each pixel may become somewhat complicated. FIG. 13 shows a configuration of the filter arrangement in this case represented in plan view.

As shown in FIG. 13, four different color filters 11A, 11B, 11C, and 11D are arranged. Among them, three different color filters 11A, 11B, and 11C are arranged in a manner similar to that of FIG. 7. In this embodiment, cells (pixels) 11D without any color filter are also incorporated. Thus, a 4'4 unit cell is provided as a repetitive unit.

Subsequently, the 4'4 unit cell is formed of two cells for red (570 nm to 650 nm), four cells for red+green (500 nm to 650 nm), two cells for red+green+blue (400 nm to 650 nm), and eight cells without any color filter.

The cell (red) includes a color filter 11A and an IR filter 15. The color filter 11A includes silicon dots 13 with diameters of 3 nm. The cell (red+green) includes a color filter 11B and an IR filter 15. The color filter 11B includes silicon dots 13 with diameters of 2 nm.

The cell (red+green+blue) includes a color filter 11C and an IR filter 15. The color filter 11C only includes a layer 12 with a low refractive index. Note that, the cell 11D having no filter includes a filter 11C which does not contain any silicon dot 13 but only includes a layer 12 with a low refractive index. In other words, the cell 11D having no filter has the same color filter layer as that of the cell (red+green+blue) but may not include an IR filter 15. The cell 11D having no filter and no IR filter 15 detects the reception of visual light and infrared light. In contrast, other cells provided with IR filters 15 detect the reception of visual light in the above wavelength ranges, respectively.

The cells 11D having no filter are arranged in a checkered pattern. In the half of the remaining pixels, cells (red+green) 11B are arranged (every column and every line). In the other half of the remaining pixels, the cells (red) 11A and the cells (red+green+blue) 11C are arranged every other line.

As formed as described above, the respective color components, red, green, and blue, of visual light can be read out and the infrared component of the incident light can also be read out. Therefore, the contrast in a shot image can be promoted and a "night-mode" shooting can also be performed. The "night-mode" picture is taken by shooting especially at low light intensity. Therefore, an image can be read out by detecting the infrared component of the incident light even though the typical camera can hardly read out an image from inherent background noises.

Figure 14A:
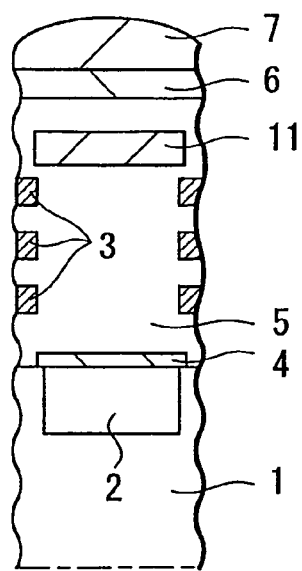
FIGS. 14A and 14B are cross section views of a single pixel in the partially modified another configuration of the solid-state imaging device in FIG. 4, where
Figure 14B:
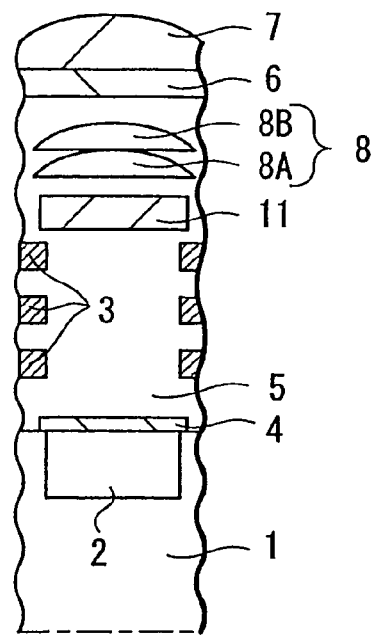

Further, FIGS. 14A and 14B respectively show the partially modified configurations of the solid-state imaging device 10 shown in FIG. 4 according to another embodiment. FIGS. 14A and 14B are cross section views each corresponding to a single pixel, respectively. In each of these structures, a color filter 11 is located at a position slightly higher than a wiring layer 3 which is a middle portion of an insulating layer 5. In particular, in the structure shown in FIG. 14B, a color filter 11 is arranged at a position corresponding to the height between inner-layer lenses 8 (8A, 8B) and a wiring layer 3.

In a CMOS solid-state imaging device, an active element and a passive element, such as transistors, are installed at a position higher than a light-receiving portion 2 and connected to each other through wiring layers 3. From a viewpoint of manufacturing based on the desired final product, it may be more convenient to produce the color filter after forming each of these elements and the wiring layers. In this case, as shown in FIGS. 14A and 14B, the color filter 11 may be preferably provided at a layer higher than the wiring layers 3 as shown in FIGS. 14A and 14B.

Figure 15A:
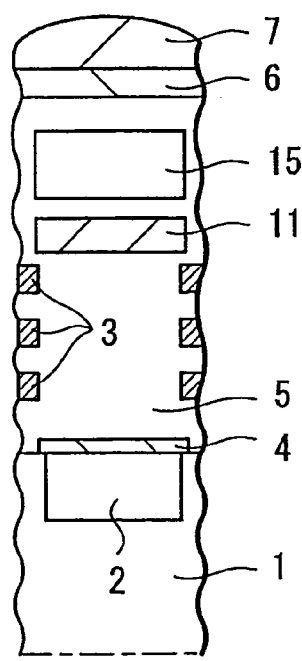
FIGS. 15A and 15B are cross section views of a single pixel in the partially modified another configuration of the solid-state imaging device in FIG. 4, where
Figure 15B:
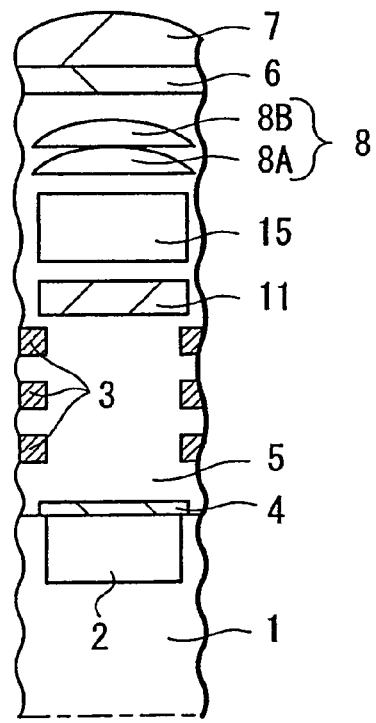

Furthermore, FIGS. 15A and 15B respectively show the configurations of the solid-state imaging device 10 shown in FIGS. 14A and 14B which are further provided with internal IR filters 15.

In each of the structures, the inner IR filter 15 is provided above a color filter 11 formed above the wiring layers 3. In the structure shown in FIG. 15B, the inner IR filter is installed between a color filter 11 and inner-layer lens 8.

If the pixel is further miniaturized, the production of an on-chip lens will be difficult. In such a case, light may be directly incident on each pixel without having the on-chip lens (i.e., a device for collecting light rays every pixel). A color image sensor, which may not generate color drift and color mixing, can be obtained by employing the optical filter layer including quantum dots according to the embodiments of the present invention even if any on-chip lens is not provided. Note that, an optical lens for the whole camera may be provided even if any on-chip lens is not provided.

Figure 16:
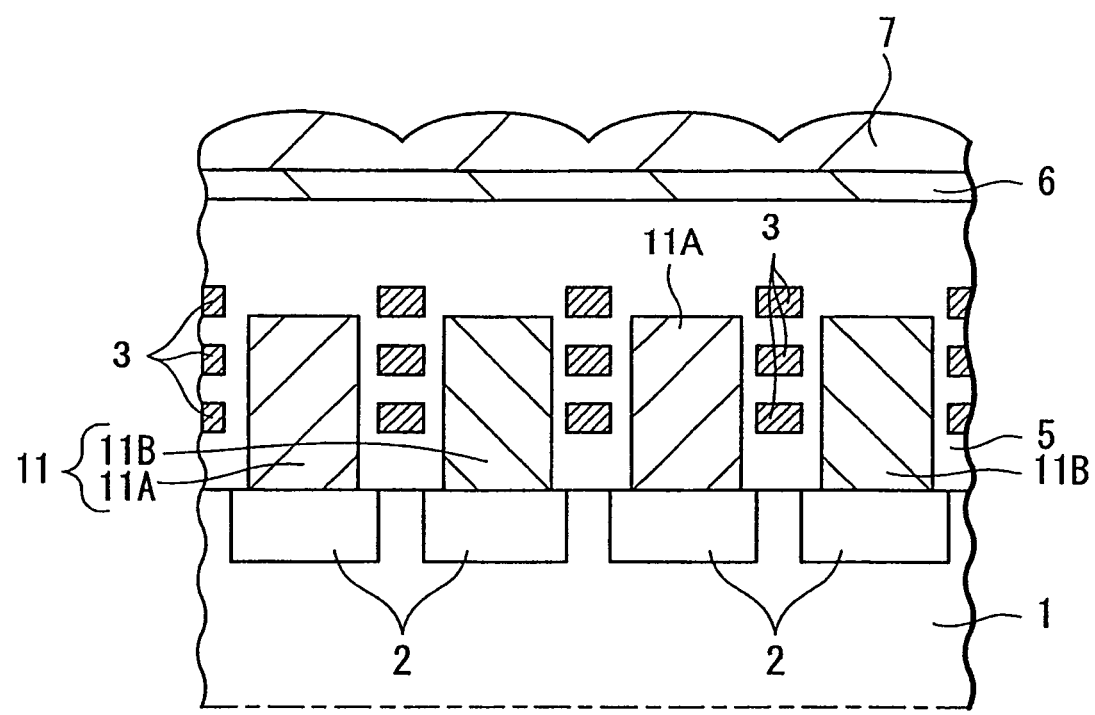
FIG. 16 is a schematic diagram (cross section view) of a solid-state imaging device according to another embodiment of the present invention.

Another embodiment of a cross section view of the solid-state imaging 10 device described in FIG. 4 will be illustrated in FIG. 16. The cross section view in FIG. 16 also includes four pixels as that in FIG. 4.

In this embodiment, color filters 11 (11A, 11B) are formed continuously from the upper surface of the light-receiving portions 2 to the opening between nearby wiring layers 3, more specifically, to the place below the third wiring layer from bottom. Therefore, the opening between wiring layer 3 can be efficiently used in this embodiment.

An example of manufacturing the structure in FIG. 16 is described below.

At first, the first and second wiring layers 3 and an insulating layer 5 covering them are sequentially formed from bottom. Then the insulating layer between wiring layers 3 are removed so that openings are formed from the upper surface of light-receiving portions 2. After that, this opening is filled up with color filters 11 (11A, 11B) formed of quantum dot layers according to manufacturing process discussed above. Subsequent planarizing process is performed on the surface, and the third wiring layer 3 is formed with insulating layer 5 covered thereon.

In each of the above-described embodiments, the explanation has been conducted when the present invention is applied on the CMOS solid-state imaging device. However, the present invention may also be applied on a CCD solid pickup device or the like or other solid-state imaging devices.

In each of the above-described embodiments, the explanation has been conducted when a color filter is formed using a silicon substrate to form silicon quantum dots in a $SiO_2$ layer.

Even if a compound semiconductor substrate or a substrate using an IV-group element other than silicon is used, a color filter can be produced by forming quantum dots and controlling the diameters of quantum dots. Furthermore, the quantum dots and the surrounding layer may be made of silicon or a silicon compound.

The present invention is not limited to any of the above-described embodiments and various embodiments of the invention can be made without departing from the gist and scope of the invention.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device, comprising:
 a light-receiving portion formed in a surface of a semiconductor substrate, the light-receiving portion being configured to carry out a photoelectric conversion; and
 an optical filter layer formed above the surface of the semiconductor substrate, the optical filter layer including quantum dots embedded in a material layer, wherein the quantum dots have an average diameter and a concentration and the material layer has a thickness such that the optical filter layer substantially filters all incident light having a wavelength below a predetermined wavelength, wherein the quantum dots have higher refractive indexes than the refractive index of the material layer, and wherein the predetermined wavelength is in the visible spectrum.

2. A solid-state imaging device according to claim 1, wherein the quantum dots have substantially equal diameters.

3. A solid-state imaging device according to claim 1, wherein the quantum dots are made of a semiconductor material.

4. A solid-state imaging device according to claim 3, wherein the quantum dots are made of silicon.

5. A solid-state imaging device according to claim 1, wherein the material layer is made of silicon oxide.

6. A solid-state imaging device according to claim 1, wherein the material layer is made of silicon nitride.

7. A solid-state imaging device according to claim 1, further comprising an optical coupling layer configured to reduce surface reflection, the optical coupling layer being formed on the optical filter layer.

8. A solid-state imaging device according to claim 1, further comprising an optical coupling layer configured to reduce surface reflection, the optical coupling layer being formed on the surface of the semiconductor substrate.

9. A solid-state imaging device according to claim 1, wherein the average diameter of the quantum dots is in the range of 0.5 nm to 10 nm.

10. A solid-state imaging device according to claim 1, wherein the concentration of the quantum dots in the optical filter layer is in the range of $1\times10^3/\mu m^2$ to $1\times10^7/\mu m^2$.

11. A solid-state imaging device according to claim 1, wherein the thickness of the optical filter layer is in the range of 100 nm to 2,000 nm.

12. A solid-state imaging device, comprising:
a first light-receiving portion formed in a first surface portion of a semiconductor substrate, the first light-receiving portion being configured to carry out photoelectric conversion;
a second light-receiving portion formed in a second surface portion of the semiconductor substrate, the second light-receiving portion being configured to carry out photoelectric conversion;
a first optical filter layer formed above the first surface portion of the semiconductor substrate, the first optical filter layer including first quantum dots embedded in a first material layer; and
a second optical filter layer formed above the second surface portion of the semiconductor substrate, the second optical filter layer including second quantum dots embedded in a second material layer,
wherein the first quantum dots have higher refractive indexes than the refractive index of the first material layer,
wherein the second quantum dots have higher refractive indexes than the refractive index of the second material layer,
the average diameter of first quantum dots is larger than the average diameter of the second quantum dots.

13. A solid-state imaging device according to claim 12, wherein diameters of the first quantum dots are substantially equal.

14. A solid-state imaging device according to claim 12, wherein diameters of the second quantum dots are substantially equal.

15. A solid-state imaging device, comprising:
a semiconductor substrate including a plurality of pixel regions, each configured to receive light incident from a first side of the semiconductor substrate and to photoelectrically convert the received light; and
a plurality of light filters, each being formed above a corresponding one of the plurality of pixel regions on the first side of the semiconductor substrate and each including quantum dots that are embedded in a material layer, the quantum dots being configured to substantially filter light of a predetermined wavelength range,
wherein the quantum dots have higher refractive indexes than the refractive index of the material layer,
wherein for a first subset of the plurality of light filters the predetermined wavelength range is a first wavelength range and for a second subset of the plurality of light filters the predetermined wavelength range is a second wavelength range different from the first wavelength range.

16. A solid-state imaging device according to claim 15, wherein for those light filters of the first subset, the quantum dots included therein have a first average diameter, and
for those light filters of the second subset, the quantum dots included therein have a second average diameter that is different than the first average diameter.

17. A solid-state imaging device according to claim 16, wherein the quantum dots included in the light filters of the first subset have substantially equal diameters as one another, and
the quantum dots included in the light filters of the second subset have substantially equal diameters as one another.

18. A solid-state imaging device according to claim 15, wherein, for each of the plurality of light filters, those of the quantum dots that are included in a same light filter have substantially equal diameters as one another.

19. A solid-state imaging device according to claim 15, wherein each of the plurality of light filters is disposed directly in contact with one of:
a surface of the semiconductor substrate on the first side thereof, and
an optical coupling layer that is configured to reduce surface reflection and that is disposed directly in contact with the surface of the semiconductor substrate on the first side thereof.

20. A solid-state imaging device according to claim 1, further comprising:
a second filter that substantially filters all incident light having a wavelength above a second predetermined wavelength such that the optical filter layer and the second filter together substantially transmit incident light having a wavelength in a range between the predetermined wavelength and the second predetermined wavelength.

21. A solid-state imaging device comprising
a photoelectric conversion region that is formed in a surface of a semiconductor substrate and that performs photoelectric conversion on incident light; and
an optical filter layer formed above the surface of the semiconductor substrate in an optical path of the incident light, the optical filter layer including quantum dots embedded in a material layer,
wherein the quantum dots have an average diameter and a concentration and the material layer has a thickness such that the optical filter layer substantially filters all incident light having a wavelength below a predetermined wavelength,
the quantum dots have higher refractive indexes than the refractive index of the material layer,
the average diameter of the quantum dots is in the range of 0.5 nm to 10 nm,
the concentration of the quantum dots in the optical filter layer is in the range of $1\times10^3/\mu m^2$ to $1\times10^7/\mu m^2$, and
the thickness of the optical filter layer is in the range of 100 nm to 2,000 nm.

* * * * *